United States Patent
Kraus et al.

(10) Patent No.: US 9,494,344 B2
(45) Date of Patent: Nov. 15, 2016

(54) METHOD FOR RECONFIGURING A CRYOSTAT CONFIGURATION FOR RECIRCULATION COOLING

(71) Applicant: BRUKER BIOSPIN AG, Faellanden (CH)

(72) Inventors: Andreas Kraus, Riedikon (CH); Robert Schauwecker, Zurich (CH); Joerg Hinderer, Waldshut-Tiengen (DE)

(73) Assignee: Bruker BioSpin AG, Faellanden (CH)

( * ) Notice: Subject to any disclaimer, the term of this patent is extended or adjusted under 35 U.S.C. 154(b) by 241 days.

(21) Appl. No.: 14/320,670

(22) Filed: Jul. 1, 2014

(65) Prior Publication Data
US 2015/0007586 A1 Jan. 8, 2015

(30) Foreign Application Priority Data

Jul. 3, 2013 (DE) .................... 10 2013 213 020

(51) Int. Cl.
| *F25B 9/00* | (2006.01) |
|---|---|
| *F25D 17/00* | (2006.01) |
| *F25D 19/00* | (2006.01) |
| *G01R 33/3815* | (2006.01) |
| *H01F 6/04* | (2006.01) |
| *G01R 33/38* | (2006.01) |

(52) U.S. Cl.
CPC .............. *F25B 9/002* (2013.01); *F25B 9/00* (2013.01); *F25D 17/00* (2013.01); *F25D 19/00* (2013.01); *G01R 33/3804* (2013.01); *G01R 33/3815* (2013.01); *H01F 6/04* (2013.01); *F17C 2221/014* (2013.01); *F17C 2221/017* (2013.01); *F17C 2270/0536* (2013.01)

(58) Field of Classification Search
CPC .......... F25B 9/002; F25B 9/02; F25B 17/00; F25B 19/00; H01F 6/04; G01R 33/3804; G01R 33/3815
See application file for complete search history.

(56) References Cited

U.S. PATENT DOCUMENTS

| 4,510,771 A | 4/1985 | Matsuda |
|---|---|---|
| 5,187,938 A | 2/1993 | Mraz |

(Continued)

FOREIGN PATENT DOCUMENTS

| EP | 0 905 436 | 3/1999 |
|---|---|---|
| EP | 1574777 | 9/2005 |
| WO | WO 95/01539 | 1/1995 |

*Primary Examiner* — Daniel Rohrhoff
(74) *Attorney, Agent, or Firm* — Paul Vincent (57) ABSTRACT

A method for converting a cryostat configuration (1) having a first container (2) with a liquid helium bath (3) and a second container (6) which is filled with liquid nitrogen (7) is characterized in that a cooling medium (12) which is in a gaseous state at a temperature of 60K and a pressure of 1 bar, is introduced into the second container and is cooled by a refrigerator (16) by means of a cooling circuit (11), the coolant lines of which are guided into the second container, to an operating temperature of ≤60K. With this retrofit for existing cryostat configurations that utilize both liquid helium and also liquid nitrogen for cooling a superconducting coil, use of liquid nitrogen can be completely avoided and the evaporation rate of the liquid helium can also be considerably reduced without having to re-liquefy the cryogens used.

15 Claims, 8 Drawing Sheets

(56) References Cited

U.S. PATENT DOCUMENTS

| | | |
|---|---|---|
| 5,201,184 A | 4/1993 | Roth |
| 5,267,445 A | 12/1993 | Schittenhelm |
| 5,404,726 A | 4/1995 | Janssen |
| 5,563,566 A | 10/1996 | Laskaris |
| 5,613,367 A | 3/1997 | Chen |
| 5,744,959 A | 4/1998 | Jeker |
| 6,181,228 B1 | 1/2001 | Laskaris |
| 2006/0096301 A1 | 5/2006 | Triebe |
| 2006/0097146 A1* | 5/2006 | Strobel .................... F25B 9/02 250/286 |
| 2006/0130493 A1* | 6/2006 | Strobel ................. F25D 19/006 62/51.1 |
| 2007/0051116 A1* | 3/2007 | Glemot ................... F25B 9/145 62/51.1 |
| 2007/0089432 A1* | 4/2007 | Boesel ................... F25D 19/006 62/51.1 |
| 2007/0182513 A1* | 8/2007 | Burgess .................... H01F 6/04 335/18 |
| 2007/0245749 A1 | 10/2007 | Atkins |
| 2009/0045895 A1* | 2/2009 | Kasten ............... G01R 33/3815 335/216 |
| 2009/0301129 A1 | 12/2009 | Wang |
| 2012/0242335 A1* | 9/2012 | Schett ................ G01R 33/3403 324/318 |

* cited by examiner

METHOD FOR RECONFIGURING A CRYOSTAT CONFIGURATION FOR RECIRCULATION COOLING

This application claims Paris convention priority from DE 10 2013 213 020.1 filed Jul. 3, 2013, the entire disclosure of which is hereby incorporated by reference.

BACKGROUND OF THE INVENTION

The invention concerns a method for converting a cryostat configuration comprising a room temperature vacuum container containing a first container with a liquid helium bath, the operating temperature of which is kept below 5K by means of helium evaporation, wherein the room temperature vacuum container also encloses a second container which is filled with liquid nitrogen for thermally shielding the first container and can be kept at an operating temperature of between 75 and 80K by means of nitrogen evaporation.

The structure and field of use of a configuration of this type, wherein both containers are arranged inside a room temperature vacuum container, is disclosed e.g. in U.S. Pat. No. 5,267,445.

A cryostat configuration of this type is used, in particular, for cooling superconducting magnet coils. Magnet coils of this type are used i.a. for NMR (nuclear magnetic resonance) measurements. NMR spectroscopy is a powerful method of instrumental analysis. RF (radio frequency) pulses are thereby irradiated into a test sample located in a strong static magnetic field and the RF reaction of the test sample is measured. The relevant information is integrally obtained over a certain area of the test sample, the so-called active volume.

Figure 8:
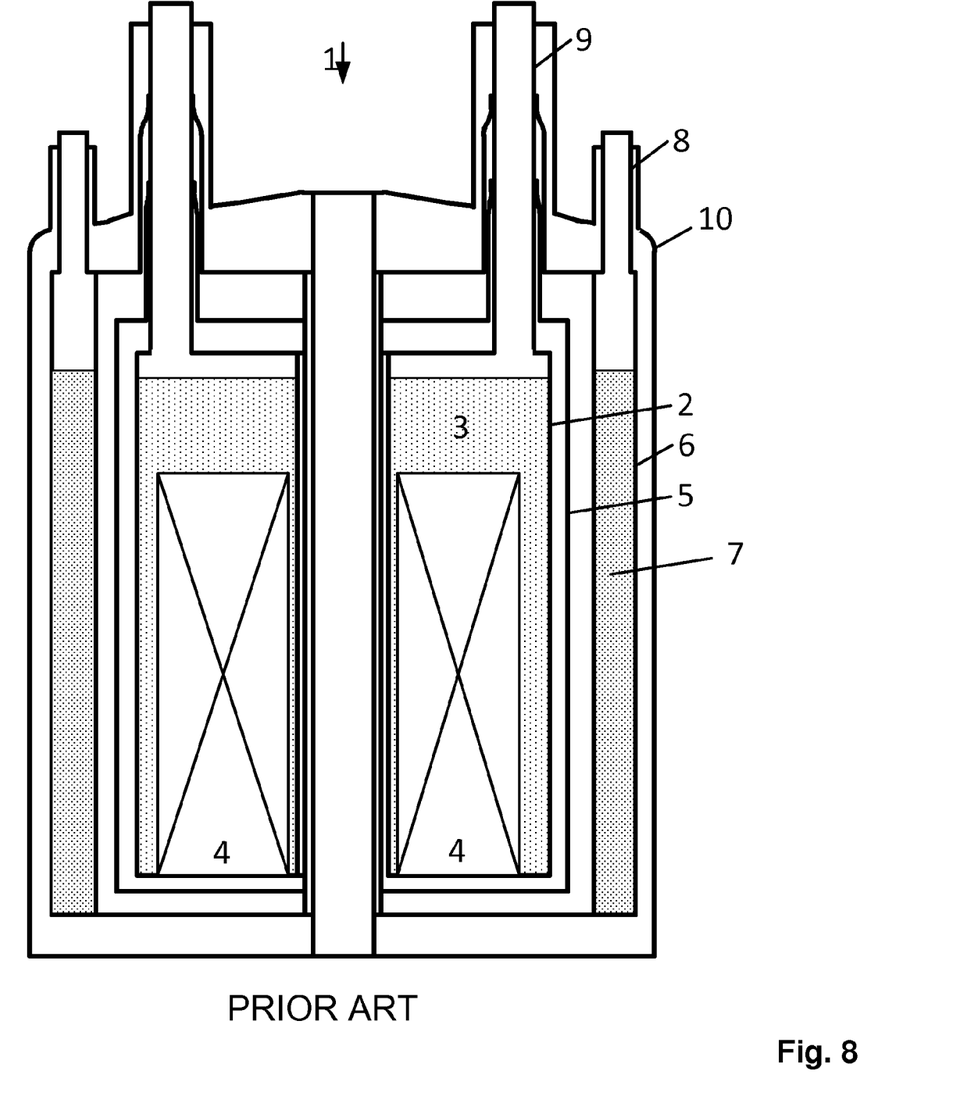
FIG. 8 shows a cryostat configuration according to prior art.

The high magnetic fields that are required for this purpose are generated by superconducting magnet coils which are advantageously operated in liquid helium. The magnet coil and the liquid helium are located in a first container. The temperature of this container remains constant due to continuous evaporation of helium. One or more radiation shields may additionally be arranged around this container. A ring-shaped second container is arranged between these radiation shields and the outer room temperature vacuum container. The second container is filled with liquid nitrogen whose temperature is kept constant at approximately 77K by means of continuous evaporation of nitrogen. A configuration of this type is illustrated in FIG. 8. This structure minimizes the heat input into the first container caused by radiation heat, thereby minimizing, in particular, the evaporation rate of helium in the first container such that helium must be refilled typically only every couple of months.

In view of this passive cooling by means of the evaporating cryogenic helium and nitrogen, liquid helium and nitrogen must always be refilled within certain time intervals. Liquid nitrogen must be refilled within considerably shorter time intervals of one to two weeks.

One substantial disadvantage of this configuration is that handling of the utilized cryogens is complicated and for this reason requires specially trained staff. Moreover, refilling also necessitates undesired interruption of measurements in the cooled apparatus, which is generally undesirable. The dependence on the supply of liquid cryogens is also especially problematic for locations where no optimum infrastructure is provided such as e.g. in developing countries (e.g. India, African countries etc.). Future price increases or shortages of cryogens will also render this type of cooling quite expensive.

The availability of mechanical refrigerators that can achieve temperatures below 4K resulted in the development of further cooling possibilities in order to reduce the dependence on liquid helium and liquid nitrogen. In addition to cooling exclusively by supplying cryogens, there are further prior art cooling variants:

cooling circuits with gaseous helium for pre-cooling or operating superconducting magnets (see for example US 2007245749 A1, EP 0 398 156 B1, WO 95 01 539 A1)

cooling circuits for cooling radiation shields or reliquefaction of nitrogen gas (e.g. in EP 1 655 616 B1)

installation of various cryocoolers into superconducting magnet systems for reliquefaction of cryogens or for cooling of radiation shields (described in EP 0 905 436 B1, U.S. Pat. No. 5,563,566 A1 or U.S. Pat. No. 5,613,367 A1)

external reliquefaction of the cryogens (e.g. in EP 1 628 089 A3)

The above-described conventional configurations for preventing or reducing consumption of liquid cryogens are all based on the assumption that the cooling circuit is either temporary or is permanently installed on the system right from the start. Configurations for subsequent installation (e.g. in EP 1 655 616 B1, EP 1 628 089 A3) strive for reliquefaction of the evaporating cryogens and therefore for a loss-free system.

This external reliquefaction of the evaporating helium and nitrogen is disadvantageous in that the cooling device must be arranged spatially above the cryostat configuration and requires an increased room height, which is problematic in many laboratories. Experiments for measuring magnetic resonance require e.g. an extremely low-vibration environment. Damping of vibrations generated during operation is correspondingly difficult due to the proximity between the cooling device and the cryostat configuration.

Alternatively, the evaporating cryogens could also be collected outside of the cryostat configuration and be reliquefied by means of a separate cryosystem. Such a system is offered e.g. by the company Cryomech ("Liquid Helium Plants") but is disadvantageous in that only helium is reliquefied and must be transferred back into the cryostat configuration within relatively short time periods.

In contrast thereto, it would be advantageous in terms of a retrofit for existing cryostat configurations which utilize both liquid helium and also liquid nitrogen e.g. for cooling a superconducting coil, to completely avoid use of liquid nitrogen by means of a retrofittable system and to moreover also considerably reduce the evaporation rate of liquid helium without having to reliquefy the cryogens that are used.

It is therefore the underlying purpose of the present invention to design a method for converting a cryostat configuration comprising the above defined features with as simple technical means as possible such that the above-mentioned disadvantages of prior art are largely prevented, thereby at least omitting use of liquid nitrogen. A further object of the present invention is to substantially reduce helium consumption of the cryostat configuration and moreover enable continuous operation over a long time period with minimum mechanical disturbances.

SUMMARY OF THE INVENTION

This complex object is achieved in a likewise surprisingly simple and effective fashion in that, in a conventional cryostat configuration comprising the above-defined features, a fluid cooling medium is introduced into the second container, which is gaseous at a temperature of 60K and a pressure of 1 bar, and the cooling medium is cooled to an operating temperature of ≤60K by a refrigerator by means of a cooling circuit, the coolant lines of which are guided into the second container.

In accordance with the invention, the originally intended function of the second container is changed in that liquid nitrogen is no longer used and the container is instead cooled to a temperature below 60K by a different coolant having a lower boiling point, which can by no means be achieved with nitrogen, since nitrogen already freezes at 63K.

The cooling medium is cooled via a closed cooling circuit using an external refrigerator in order to keep the low temperature of the cooling medium. The coolant lines of the cooling circuit are connected to the outputs of the second container through which nitrogen gas normally flows to the outside in conventional cryostat configurations according to prior art. Refrigerators which achieve the required cooling performances and temperatures below 60K are commercially available. Pulse tube coolers, Gifford-McMahon coolers or Stirling coolers can e.g. be used as refrigerators. However, up to now, none of the experts in this field has considered using refrigerators of this type in a closed cooling circuit for cooling the gaseous cryogen (previously always nitrogen) in the second container but exclusively only for cooling or reliquefying the helium in the first container.

The evaporation rate of liquid helium in the first container is decisively determined by the heat input in the form of thermal radiation and thermal conduction between the first container and the second container that is arranged around the first. The second container is normally at a constant temperature which was determined up to now by the boiling point of nitrogen of approximately 77K at a pressure of 1 bar.

One possibility of reducing the evaporation rate of liquid helium from the first container is obtained in a very simple fashion by reducing the temperature of the second container (with respect to the previously normal temperature level of liquid nitrogen). By converting the second container to cooling by means of a different cooling fluid which has a substantially lower boiling point than nitrogen, the evaporation rate of helium from the first container can be reduced to considerably lower values (e.g. 50% of the normal value) since the cooling medium is in good thermal contact with the second container even in a gaseous state, i.e. the second container consequently assumes the temperature of the cooling medium.

This achieves two substantial advantages in a surprisingly simple fashion. Firstly, use of liquid nitrogen is completely avoided and secondly, the evaporation rate of liquid helium can be reduced, thereby decisively reducing the helium consumption.

The lower evaporation rate of helium moreover offers the great advantage that helium must be refilled less frequently and at larger intervals. Dwell times of more than one year can easily be achieved in this fashion. This is of great advantage, in particular, in countries in which liquid helium can be procured only within large time intervals and the helium price is particularly high.

The inventive system is furthermore advantageous in that it is only connected to the second container of the cryostat configuration via flexible vacuum-insulated coolant lines. For this reason, the refrigerator can be freely placed next to the cryostat configuration without any limitations with respect to room height and requires only little space.

Another advantage results from vibrational decoupling between the external refrigerator and the cryostat configuration which are only connected by means of the flexible vacuum-insulated coolant lines. For this reason, refrigerators can e.g. be used that have a higher vibration level but have a greater thermodynamic efficiency, i.e. yield better cooling performance with the same electrical power. Refrigerators of this type are moreover often considerably less expensive and more robust with respect to their service life.

Since the cooling circuit is closed, refilling or replacing of coolant is not necessary during operation. Since the refrigerator can be largely freely selected, the customers can choose different cooling powers in accordance with their requirements. For this reason, the filling intervals for refilling liquid helium into the first container can be varied within a wide range and e.g. be combined with the service intervals for the refrigerator.

In preferred embodiments of the inventive method, helium or neon is used as the gaseous cooling medium. These two lightest inert gases have already been used in cryotechnology for many decades to generate extremely low temperatures during use, since they remain in a gaseous state down to low temperatures during normal conditions, whereas nitrogen already freezes at 63K. In particular, helium only condenses at 4.2K and helium gas is much easier to obtain in the form of compressed gas cylinders than is liquid helium.

In one advantageous class of embodiments of the inventive method, a heat exchanger is arranged in the second container and is connected to the coolant lines of the cooling circuit and the cooling medium is cooled to an operating temperature of ≤60K by means of the heat exchanger. Advantages and mode of operation are described in detail in the description in connection with FIG. 2.

One class of alternative embodiments in this respect is particularly preferred, in which the coolant lines of the cooling circuit are open inside the second container, wherein the cooling medium is guided from the second container into the coolant lines of the cooling circuit and cooled to an operating temperature of ≤60K. Advantages and mode of operation are described in detail in the description in connection with FIG. 1.

In one further preferred variant of the inventive method, the second container is filled with liquid nitrogen prior to conversion, and is supplemented or replaced by the introduced cooling medium during conversion of the cryostat configuration. In this case, a system is converted which has already been in operation in its original configuration, i.e. with evaporating nitrogen in the second container, and is then converted in accordance with the inventive method. This method is therefore advantageous since it enables very simple conversion of all cryostat configurations that have already been supplied to customers and are already in operation.

In another advantageous method variant, an amount of nitrogen is left in and/or introduced into the second container in addition to the fluid cooling medium, the nitrogen occupying a volume of at least 5 l at an operating temperature of ≤60K. Advantages and mode of operation can be extracted in detail from the description in connection with FIG. 5.

The present invention also concerns a cryostat configuration for performing the above-mentioned inventive method with a room temperature vacuum container in which a first container containing a liquid helium bath is arranged, the operating temperature of which is held below 5K by means of helium evaporation, wherein a second container is also arranged in the room temperature vacuum container, which is filled with liquid nitrogen for thermally shielding the first container and which can be kept at an operating temperature of 75 to 80K by means of nitrogen evaporation. This cryostat configuration is characterized in that a fluid cooling medium is provided in the second container which is gaseous at a temperature of 60K and at a pressure of 1 bar, that coolant lines are guided into the second container and the cooling medium is cooled to an operating temperature of ≤60K by a refrigerator and a cooling circuit.

This cryostat configuration has the advantage that the second container is already cooled during first start-up by the cooling medium that circulates in the cooling circuit and the operator of the device benefits from the advantages right from the start. The configuration has furthermore the great advantage that it can be converted back at any time, i.e. the second container can be disconnected from the cooling circuit and filled with liquid nitrogen without impairing normal use of the cryostat configuration.

One preferred embodiment of the inventive cryostat configuration is characterized in that it is part of a nuclear magnetic resonance apparatus and is used to cool a superconducting magnet configuration. Apparatus of this type are generally used for analysis purposes and have high capacity utilization rates such that disturbance-free and, in particular, low-maintenance operation is advantageous. This is achieved by the present invention in that refilling of liquid nitrogen is no longer required and the refilling intervals for liquid helium are also considerably extended.

In a further development of this and/or the previously described cryostat configuration, an element for insulating mechanical vibrations is integrated in the coolant lines of the cooling circuit. Advantages and mode of operation can be extracted in detail from the description in connection with FIG. 3.

In further advantageous variants, the cryostat configuration has a cooling medium tank that is arranged outside of the room temperature vacuum container and by means of which the second container and/or the cooling circuit can be supplied with cooling medium in order to counteract pressure fluctuations. The advantages and mode of operation can be extracted in detail from the description in connection with FIG. 4.

One further preferred embodiment of the inventive cryostat configuration is characterized in that the second container has a volume of at least 50.

This configuration has the advantage that the second container has a volume which is sufficiently large to permit both operation with liquid nitrogen and also operation with the cooling circuit.

Further preferred embodiments of the invention are characterized in that the cooling circuit comprises a compactor which is designed as a refrigerator compressor, as a cold gas compressor or as a pump that is operated at ambient temperature and is integrated in the cooling circuit by a counterflow heat exchanger. The coolant must circulate in the cooling circuit for cooling the second container by means of a thermally conducting connection to the cooling medium and the coolant, since it is heated up inside the second container and must be cooled again by the refrigerator. In order to be able to compress the coolant at room temperature, a counterflow heat exchanger of the type that is used in many fields of application in heating and cooling technology is typically used. Further advantages and the mode of operation of a cold gas compressor can be extracted in detail from the description in connection with FIG. 6.

One class of embodiments of the inventive cryostat configuration is also particularly advantageous, which is characterized in that the cooling circuit has a Joule-Thomson expansion stage. Advantages and the mode of operation can be extracted in detail from the description in connection with FIG. 7.

Further advantages of the invention can be extracted from the description and the drawing. The features mentioned above and below can be used in accordance with the invention either individually or collectively in arbitrary combination. The embodiments shown and described are not to be taken as exhaustive enumeration but have exemplary character for describing the invention.

The invention is illustrated in the drawing and is explained in more detail with reference to embodiments.

DESCRIPTION OF THE PREFERRED EMBODIMENT

The present invention concerns, in general, a method for converting a conventional cryostat configuration of prior art, which is schematically illustrated in FIG. 8 and which has been extensively discussed above.

The cryostat configuration 1 has a room temperature vacuum container 10 housing a first container 2 with a liquid helium bath 3, the operating temperature of which is kept below 5K by means of helium evaporation, wherein the room temperature vacuum container 10 additionally contains a second container 6 which is filled with a liquid nitrogen bath 7 for thermally shielding the first container 2, and can be kept at an operating temperature of 75 to 80K by means of nitrogen evaporation.

The cryostat configuration 1 according to prior art and illustrated in FIG. 8, as well as the inventive configuration are typically used for NMR devices. The first container 2 of the configuration 1 is filled with liquid helium 3 and generally contains a superconducting magnet configuration 4 which is surrounded by a radiation shield 5 that, in turn, is surrounded by the second container 6 containing liquid nitrogen 7. The room temperature vacuum container 10 surrounds both containers 2, 6 and the radiation shield 5. The first container 2 has a filling opening 9 and the second container 6 has a filling opening 8 through which the evaporating cryogens can escape and each of which can also be used for refilling.

The helium evaporation rate from the first container 2 is determined by the heat input from the outside due to radiation and thermal conduction through the filling openings 8, 9. Due to the vacuum that prevails in the outer room temperature container 10 and the described onion-like layered structure of the configuration 1, the helium evaporation rate can typically be kept less than 100 ml/h.

In contrast thereto, the present invention is characterized in that, in the course of conversion or retrofitting of a cryostat configuration 1 in accordance with prior art, a fluid cooling medium 12 is introduced into the second container 6 which is gaseous at a temperature of 60K and a pressure of 1 bar and the cooling medium 12 is cooled to an operating temperature of ≤60K by a refrigerator 16 by means of a cooling circuit 11, the coolant lines of which are guided into the second container 6.

Figure 1:
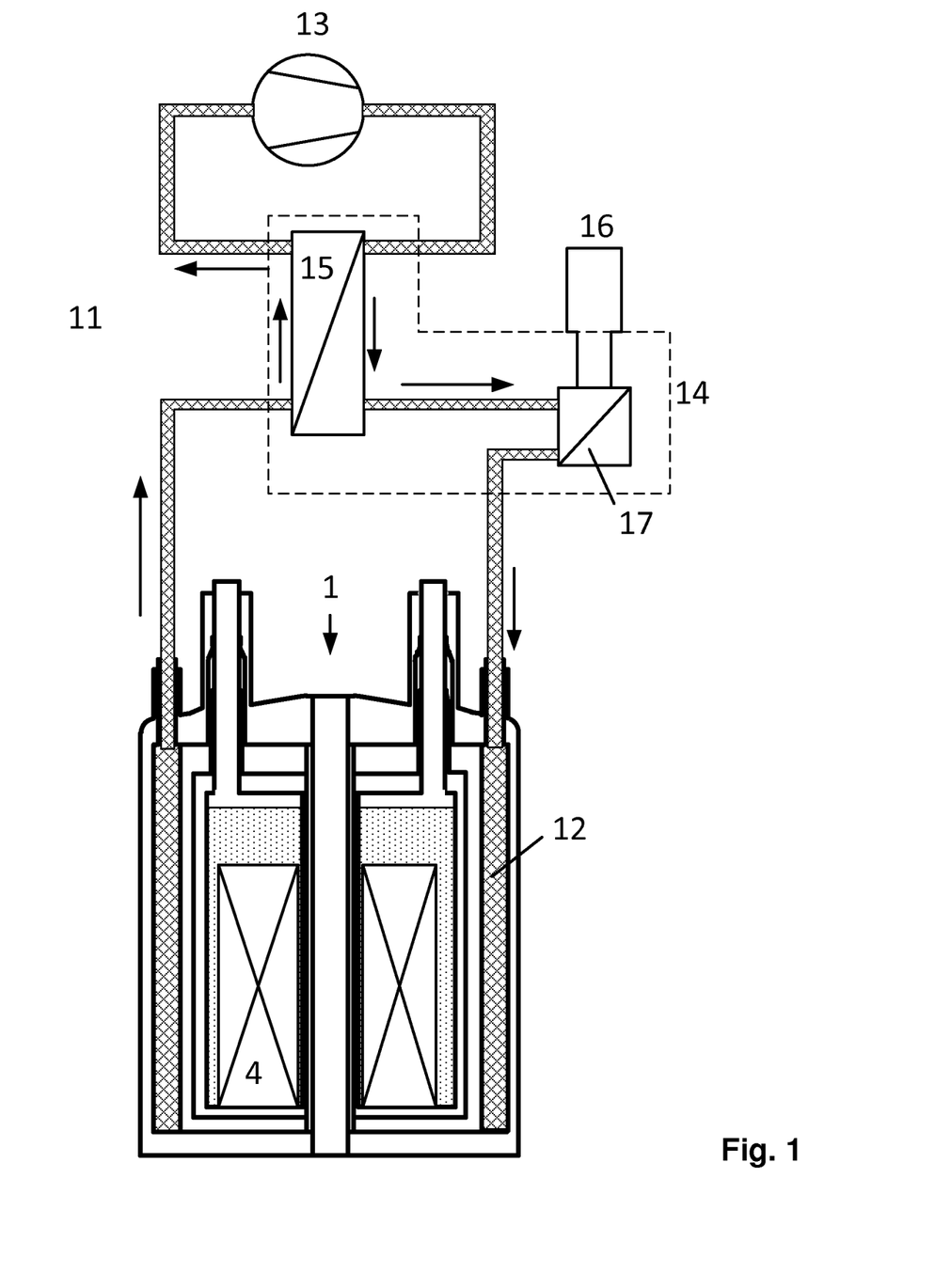
FIG. 1 shows a schematic vertical section through an embodiment of the inventive cryostat configuration, in which the coolant that circulates in the cooling circuit is identical with that in the second container.

FIG. 1 schematically shows an embodiment of the inventive cryostat configuration 1 with cooling circuit 11 which is connected to the filling openings of the second container 6. In the illustrated embodiment, the cooling medium in the second container 6 is identical with the coolant that circulates in the cooling circuit 11. The cooling medium 12 is guided by a compressor 13 via a counterflow heat exchanger 15 to a second heat exchanger 17 which is cooled by the refrigerator 16. The cooling medium 12 then flows through the second container 6 and cools it to a temperature of below 60K. The cooling medium 12 that leaves the second container 6 subsequently flows through the counterflow heat exchanger 15 back to the compressor 13. The heat exchangers 15, 17 and the refrigerator 16 are installed in a closed coldbox 14 which is held under vacuum.

Figure 2:
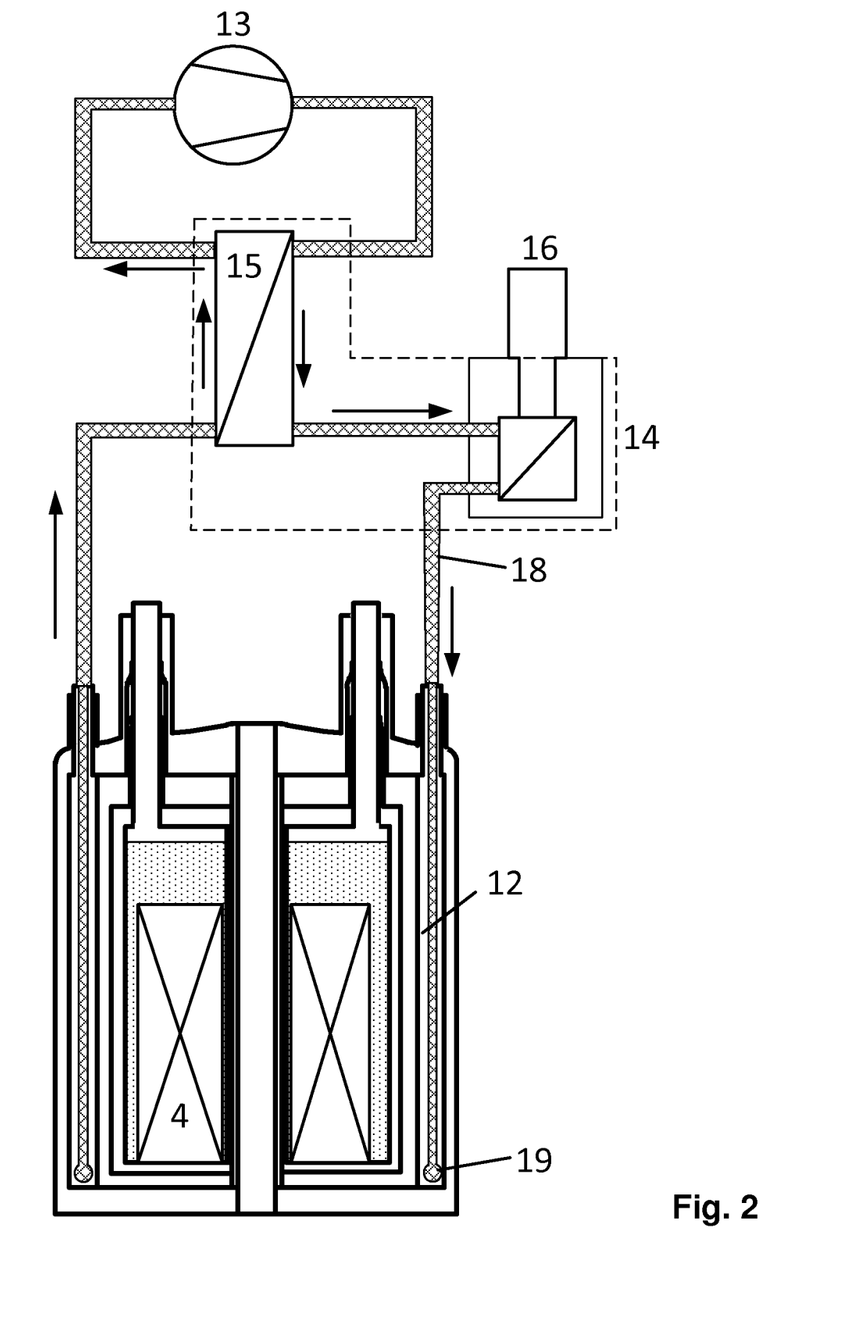
FIG. 2 shows an embodiment like in FIG. 1, however, with the second container comprising a different cooling medium than the cooling circuit.

FIG. 2 shows an embodiment that is similar to FIG. 1, in which, however the cooling medium 12 in the second container 6 does not correspond to the coolant 18 that circulates in the cooling circuit 11. The heat exchange in the second container 6 is performed via the surface of a heat exchanging element 19. This element may e.g. be introduced into the second container 6 using a long hose.

This is advantageous in that the cooling circuit 11 is completely tight with respect to the cryostat configuration 1. For this reason, a different coolant 18 can be used in the cooling circuit 11 and the working pressure of the coolant 18 is not dependent on the cooling pressure in the second container 6. Since the second container 6 only permits a slight overpressure with respect to atmosphere due to its corresponding mechanical design, the pressure in the cooling circuit 11 can be selected to be much higher, thereby increasing the density of the coolant 18 and increasing the thermodynamic efficiency of the cooling loop.

Figure 3:
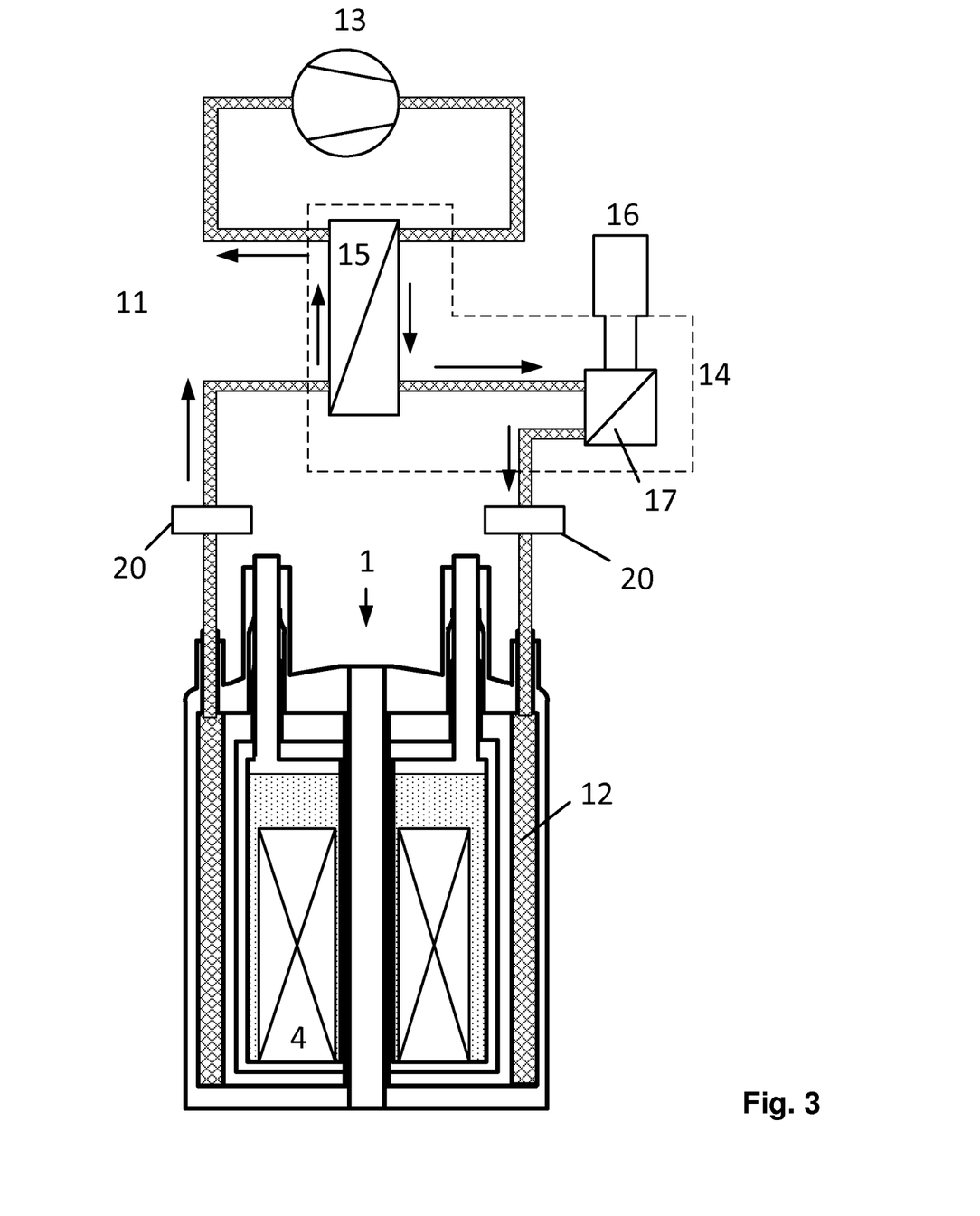
FIG. 3 shows an embodiment like in FIG. 1, however with elements for damping vibrations on the coolant lines.

The coolant lines can transfer vibrations from the compressor 13 and refrigerator 16 to the cryostat configuration 1. In case of very sensitive, in particular, high-resolution spectroscopic measurements, these vibrations can cause unacceptable disturbances in the measurement signal. In contrast to the embodiment of FIG. 1, the coolant lines of the configuration illustrated in FIG. 3 are therefore mechanically connected to damping elements 20 for damping vibrations. Such damping elements may be passive or active damping elements and consist e.g. of a massive metal foot to which the coolant line is connected in a non-positive fashion in order to damp vibrations.

Figure 4:
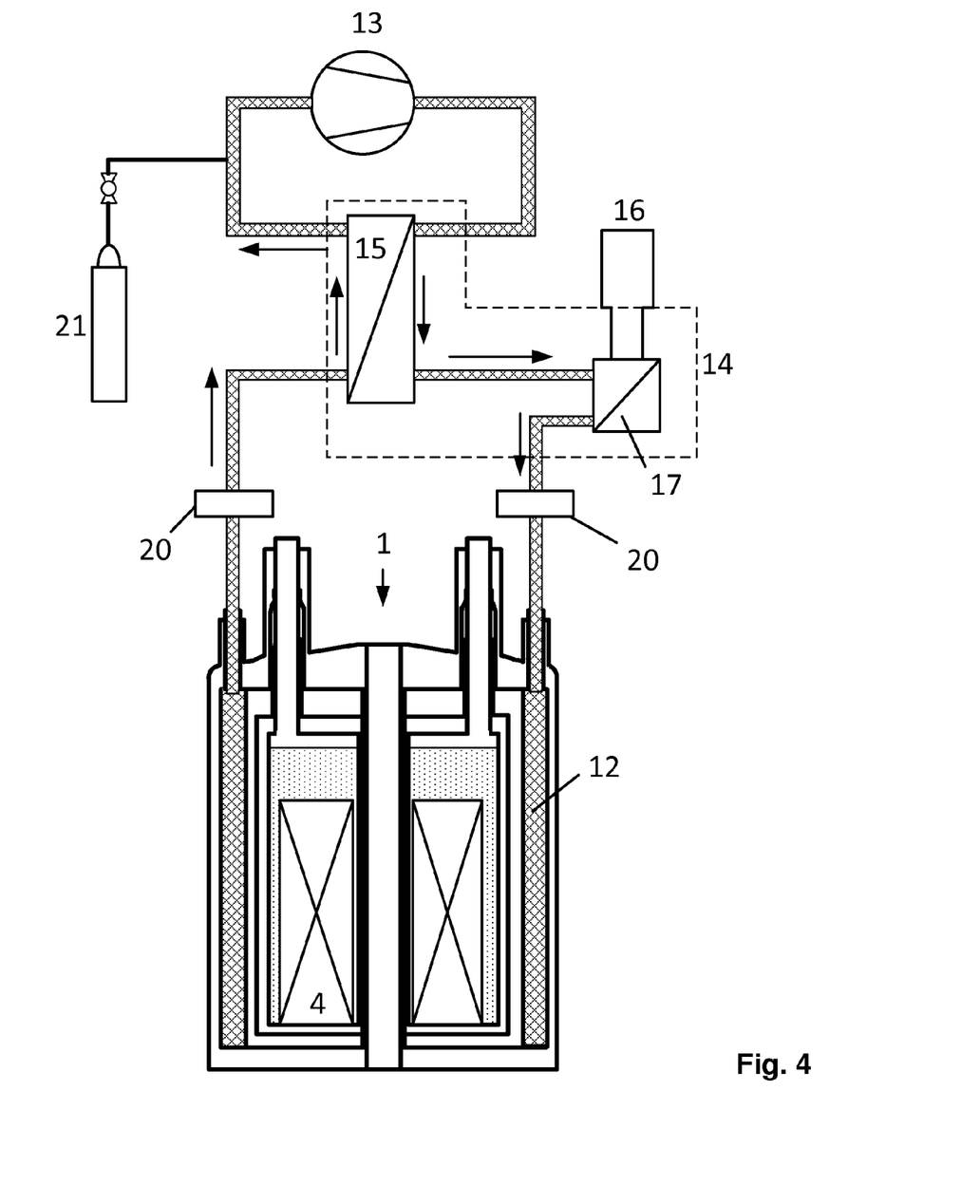
FIG. 4 shows an embodiment like in FIG. 3, however, with an additional supply volume of cooling medium in a cooling medium tank that is connected to the coolant circuit.

In addition to the configuration in accordance with FIG. 3, the cryostat configuration 1 illustrated in FIG. 4 has a cooling medium tank 21 that is connected to the coolant circuit 11. The cooling medium tank 21 stores a supply of cooling medium 12 or 18 and keeps the pressure in the cooling circuit 11 as constant as possible. The cooling medium tank 21 may e.g. comprise a pressure cylinder which is connected to the coolant circuit 11 via a pressure relief valve.

Figure 5:
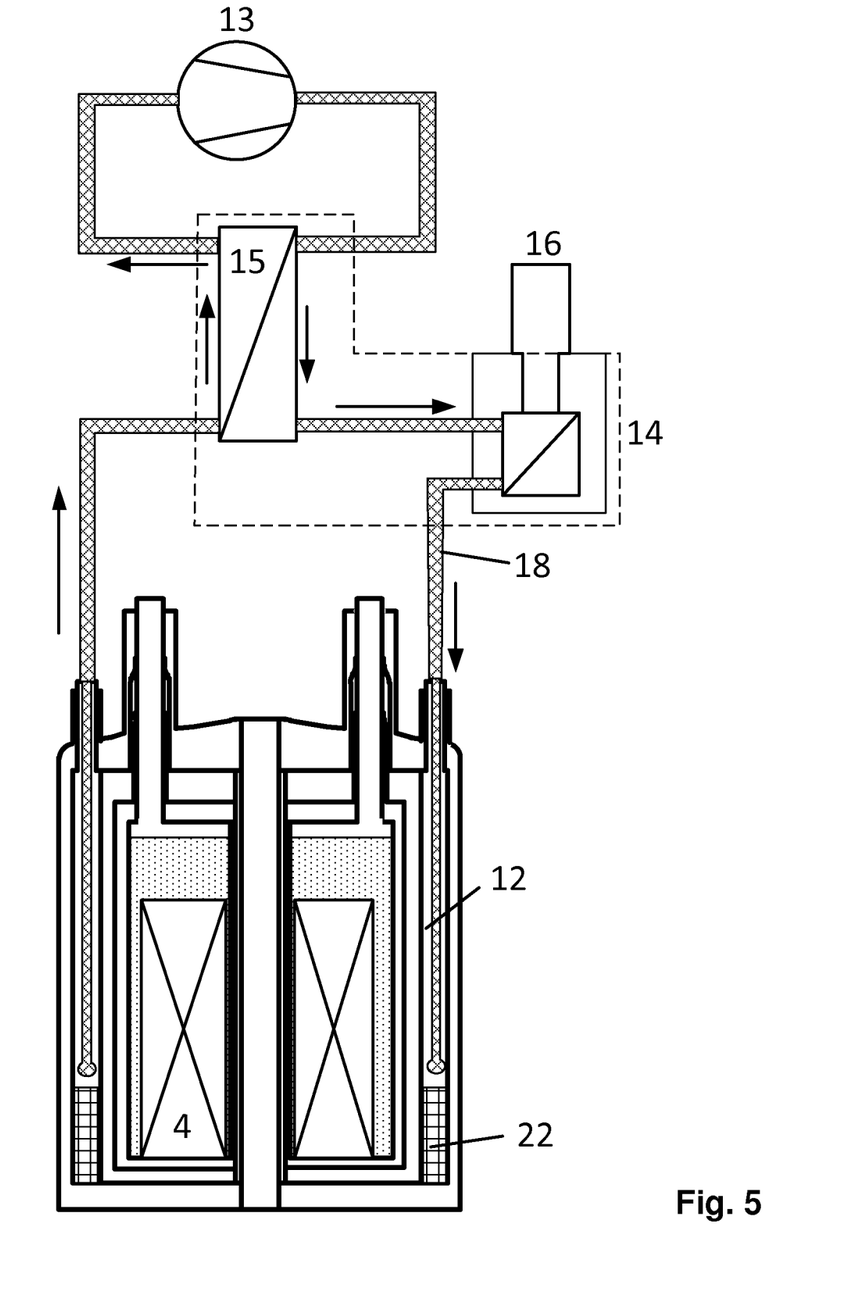
FIG. 5 shows an embodiment like in FIG. 2, however, with an additional residual volume of liquid nitrogen that has not been completely removed during conversion.

In comparison with the configuration according to FIG. 2, the liquid nitrogen 7 contained in the second container 6 for the intended use of the cryostat configuration 1 in the configuration according to FIG. 5 was not completely removed prior to connection of the cooling circuit 11. Since the fluid chambers of coolant 18 and cooling medium 12 are not connected, the nitrogen will freeze at temperatures below approximately 63K. The advantage of this nitrogen reservoir 22 for a residual amount of N2 is apparent in cases in which the coolant circuit 11 is no longer fully functional, for example due to a power breakdown or defect of the refrigerator 16 or of the compressor 13. In these cases, the second container 6 will only heat up to a temperature of approximately 77K due to the contained nitrogen, which ensures operation of the cryostat configuration 1 over a long period.

Figure 6:
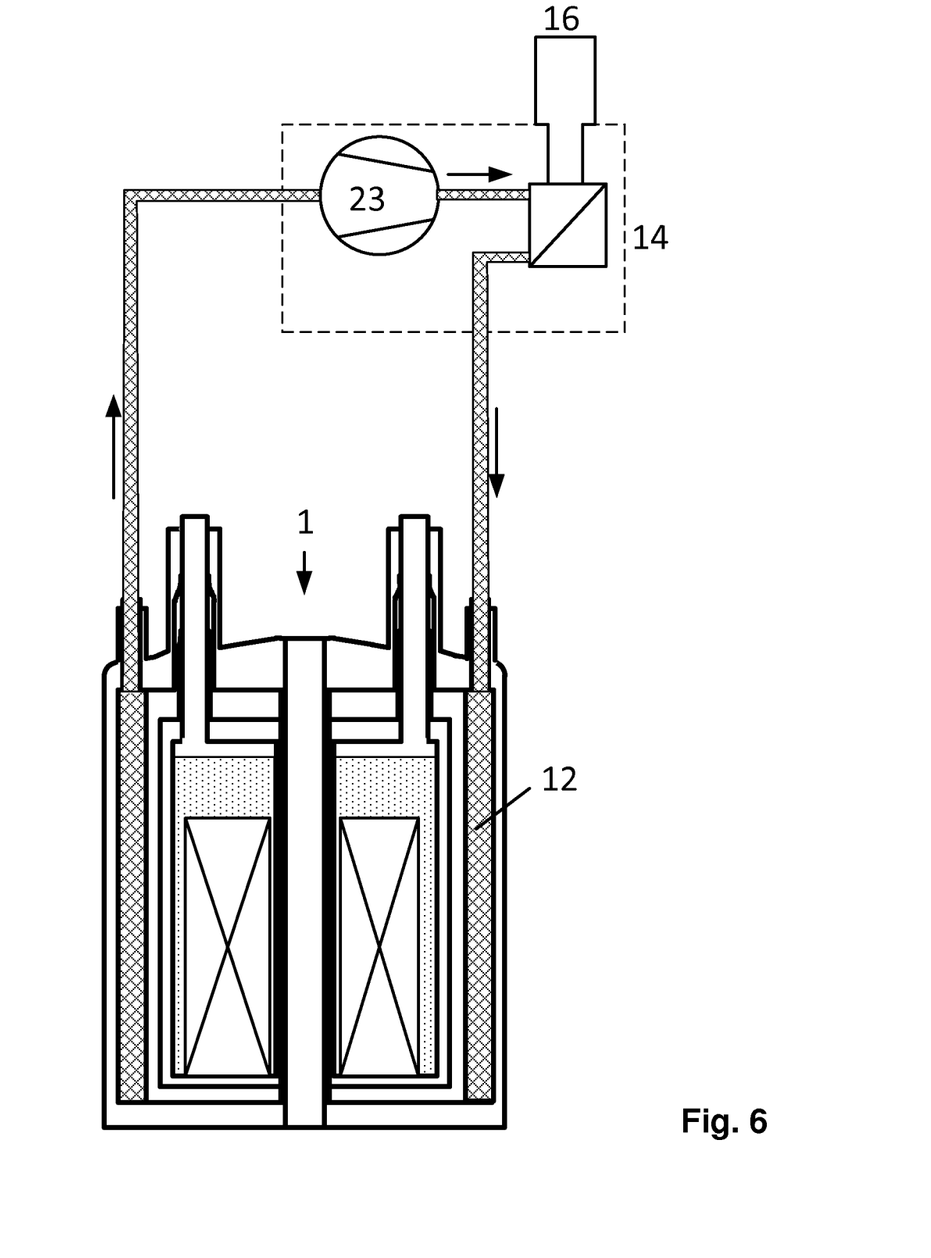
FIG. 6 shows an embodiment like in FIG. 1, however, with a compressor integrated in the coldbox, which compresses the coolant at a low temperature and obviates the need for a counterflow heat exchanger.

In comparison with the configuration according to FIG. 1, the cryostat configuration 1 illustrated in FIG. 6 has a cold gas compressor 23 that is integrated in the coldbox 14 and operates at the temperature of the cold coolant 12. This is advantageous in that the coolant 12 does not have to be heated in a counterflow heat exchanger prior to reaching the compressor 23. Compressors of this type that operate at low temperatures are distributed e.g. by the company Cryozone BV. This configuration considerably increases the efficiency of the coolant circuit 11 while reducing the cost due to omission of the counterflow heat exchanger.

Figure 7:
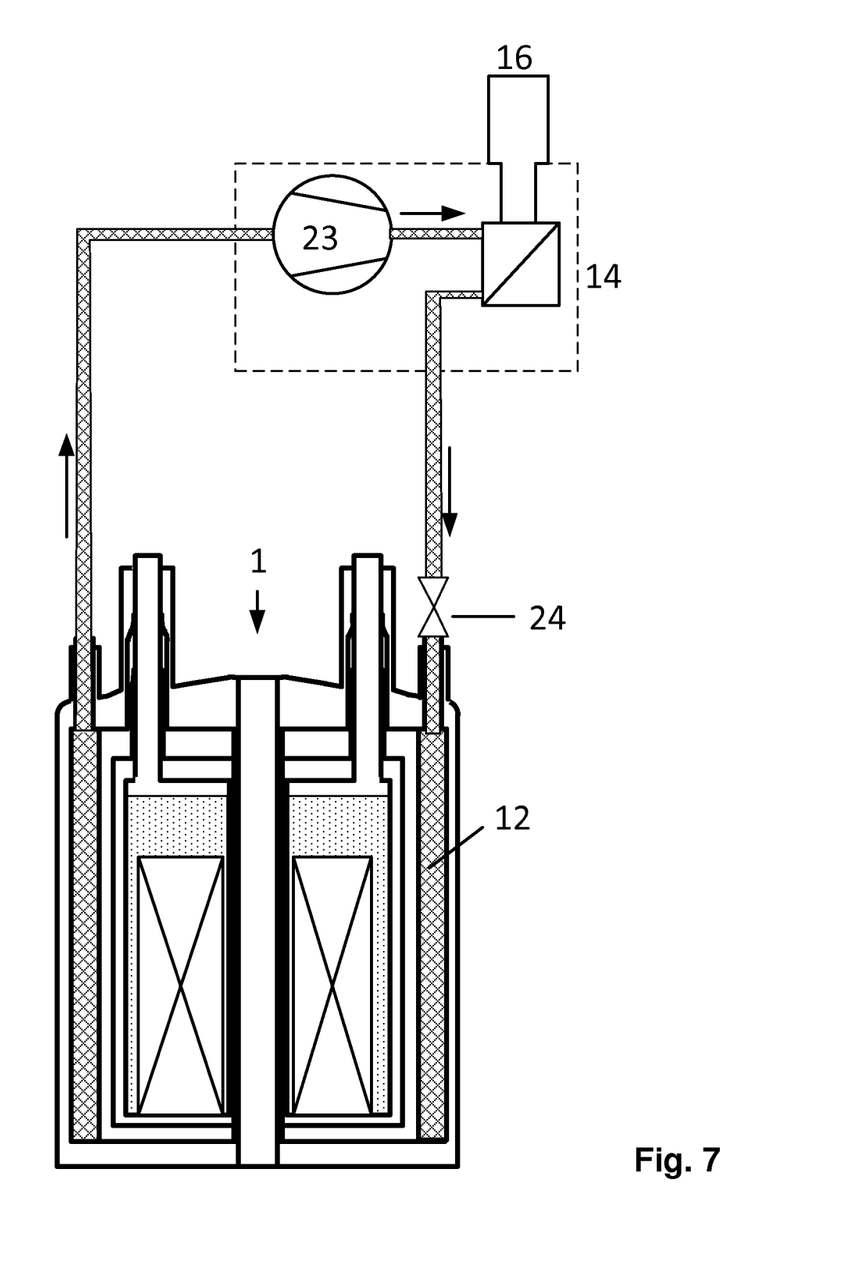
FIG. 7 shows an embodiment like in FIG. 6, however, with an additional Joule-Thomson valve in the coolant line prior to entry into the second container.

In comparison with the configuration in accordance with FIG. 6, the coolant 12 of the cryostat configuration illustrated in FIG. 7 is released upon entry into the second container 6 via a Joule-Thomson expansion valve 24. Depending on the temperature and pressure, release of gas can reduce the temperature, thereby achieving an additional cooling effect. This effect is utilized e.g. in the well-known Linde method for liquefying air.

This additional cooling can be utilized when the compressor 23 yields high compression of the coolant 12 and a suitable gas such as e.g. neon is used for the coolant 12. In this fashion, the temperatures in the second container 6 can be even further reduced, which again further reduces the evaporation rate of helium from the first container 2.

FIG. 8 shows the prior art that has been described in detail above.

LIST OF REFERENCE NUMERALS (1) cryostat configuration
(2) first container
(3) liquid helium bath
(4) magnet configuration
(5) radiation shield
(6) second container
(7) liquid nitrogen bath
(8) filling opening of second container
(9) filling opening of first container
(10) room temperature vacuum container
(11) cooling circuit
(12) cooling medium (13) compressor
(14) coldbox
(15) counterflow heat exchanger
(16) refrigerator
(17) heat exchanger
(18) coolant in the cooling circuit
(19) heat exchanging element
(20) damping element
(21) cooling medium tank
(22) residual amount N2
(23) cold gas compressor for cold coolant
(24) Joule-Thomson expansion valve

REFERENCE LIST

[1] U.S. Pat. No. 5,267,445
[2] US 2007245749 A1
[3] EP 0398156 B1
[4] WO 95 01 539 A1
[5] EP 1 655 616 B1
[6] EP 0 905 436 B1
[7] U.S. Pat. No. 5,563,566 A1
[8] U.S. Pat. No. 5,613,367 A1
[9] EP 1 628 089 A3

We claim:

1. A method for converting a cryostat configuration having a room temperature vacuum container housing a first container structured for holding a liquid helium bath at an operating temperature which is kept below 5K by means of helium evaporation, wherein the room temperature vacuum container also contains a second container structured to hold liquid nitrogen for thermally shielding the first container and to keep that liquid nitrogen at an operating temperature of between 75 and 80K by means of nitrogen evaporation, the method comprising the steps of:
    a) introducing a fluid cooling medium into the second container, the fluid cooling medium being gaseous at a temperature of 60K and a pressure of 1 bar; and
    b) cooling the cooling medium to an operating temperature of ≤60K using a refrigerator and a cooling circuit, the cooling circuit having coolant lines which are guided into the second container.

2. The method of claim 1, wherein helium or neon is used as the fluid cooling medium.

3. The method of claim 1, wherein a heat exchanger is arranged in the second container and is connected to the coolant lines of the cooling circuit, the cooling medium being cooled to an operating temperature of ≤60K by means of the heat exchanger.

4. The method of claim 1, wherein the coolant lines of the cooling circuit are open inside the second container such that the cooling medium is guided from the second container into the coolant lines of the cooling circuit and cooled to an operating temperature of ≤60K.

5. The method of claim 1, wherein prior to step a), the second container is filled with liquid nitrogen which is supplemented or replaced by the introduced cooling medium during conversion of the cryostat configuration.

6. The method of claim 1, wherein an amount of nitrogen is left in or introduced Into the second container in addition to the fluid cooling medium, the nitrogen occupying a volume of at least 5 l at an operating temperature of ≤60K.

7. A cryostat configuration for carrying out the method of claim 1, the cryostat configuration comprising:
    a room temperature vacuum container housing a first container, said first container being disposed, structured and dimensioned to hold a liquid helium bath at an operating temperature which is held below 5K by means of helium evaporation, said vacuum container also housing a second container, said second container being disposed, structured and dimensioned to hold liquid nitrogen for thermally shielding said first container and for maintaining the liquid nitrogen at an operating temperature of 75 to 80K by means of nitrogen evaporation; and
    a cooling circuit, said cooling circuit comprising a refrigerator as well as cooling lines communicating with said refrigerator and extending into said second container, wherein said refrigerator and said cooling lines are disposed, structured and dimensioned to cool a fluid cooling medium to an operating temperature of ≤60K and to pass that cooling medium into said second container, said fluid cooling medium being gaseous at a temperature of 60K and at a pressure of 1 bar.

8. The cryostat configuration of claim 7, wherein the cryostat configuration is structured within a nuclear magnetic resonance apparatus to cool a superconducting magnet configuration.

9. The cryostat configuration of claim 7, wherein a damping element is provided in said coolant lines of said cooling circuit for insulating mechanical vibrations.

10. The cryostat configuration of claim 7, further comprising a cooling medium tank that is arranged outside of said room temperature vacuum container and by means of which said second container or said cooling circuit can be supplied with cooling medium in order to counteract pressure fluctuations.

11. The cryostat configuration of claim 7, further comprising a nitrogen reservoir for a residual amount of liquid and/or solid nitrogen.

12. The cryostat configuration of claim 7, wherein said second container has a volume of at least 50 l.

13. The cryostat configuration of claim 7, wherein said refrigerator is a pulse tube cooler, a Gifford-McMahon cooler or a Stirling cooler.

14. The cryostat configuration of claim 7, wherein said cooling circuit has a compactor which is designed as a compressor for said refrigerator, as a cold gas compressor or as a pump operated at ambient temperatures, said compactor being integrated in said cooling circuit using a counter flow heat exchanger.

15. The cryostat configuration of claim 7, wherein said cooling circuit has a Joule-Thomson expansion stage.

* * * * *